United States Patent
Li et al.

(10) Patent No.: US 9,995,807 B2
(45) Date of Patent: Jun. 12, 2018

(54) CONTROL UNIT AND METHOD TO MONITOR A DATA ACQUISITION OF MAGNETIC RESONANCE IMAGE DATA

(71) Applicant: Siemens Aktiengesellschaft, Munich (DE)

(72) Inventors: Guobin Li, Freiburg (DE); Dominik Paul, Bubenreuth (DE)

(73) Assignees: Siemens Aktiengesellschaft, Munich (DE); Universitatsklinikum Freiburg, Freiburg (DE)

( * ) Notice: Subject to any disclaimer, the term of this patent is extended or adjusted under 35 U.S.C. 154(b) by 777 days.

(21) Appl. No.: 14/477,025

(22) Filed: Sep. 4, 2014

(65) Prior Publication Data

US 2015/0061673 A1    Mar. 5, 2015

(30) Foreign Application Priority Data

Sep. 4, 2013  (DE) ........................ 10 2013 217 617

(51) Int. Cl.
  *G01V 3/00*  (2006.01)
  *G01R 33/48*  (2006.01)
  *G01R 33/54*  (2006.01)
  *G01R 33/56*  (2006.01)

(52) U.S. Cl.
  CPC ........ *G01R 33/4818* (2013.01); *G01R 33/543* (2013.01); *G01R 33/56* (2013.01)

(58) Field of Classification Search
  CPC .............. G01R 33/543; G01R 33/5659; G01R 33/3415; G01R 33/36; A61B 5/055
  See application file for complete search history.

(56) References Cited

U.S. PATENT DOCUMENTS

| 5,384,536 A | 1/1995 | Murakami et al. | |
|---|---|---|---|
| 2008/0045828 A1* | 2/2008 | Shu ..................... | G01R 33/4824 600/410 |
| 2008/0139919 A1* | 6/2008 | Kannengiesser .. | G01R 33/4824 600/410 |
| 2009/0082656 A1* | 3/2009 | Bayram ............. | G01R 33/4818 600/410 |
| 2009/0278539 A1 | 11/2009 | Beatty | |
| 2010/0036234 A1* | 2/2010 | Pfeuffer ........... | G01R 33/56366 600/410 |
| 2010/0201363 A1* | 8/2010 | Griswold ........... | G01R 33/4824 324/314 |

(Continued)

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

In a control method and control unit to monitor a data acquisition of magnetic resonance image data of an imaging area located in a measurement volume of a magnetic resonance apparatus, an RF excitation pulse is radiated by an RF transmission/reception device of the magnetic resonance apparatus, raw data are acquired after a time after the radiated excitation pulse, by means of the RF transmission/reception device, and store the raw data, the raw data are transmitted to a monitoring unit and (a) through (c) are repeated while switching different gradients for spatial coding by readout of k-space corresponding to the imaging area along trajectories that are predetermined by the switched gradients, up to a termination criterion that is predetermined by the monitoring unit.

10 Claims, 2 Drawing Sheets

(56) References Cited

U.S. PATENT DOCUMENTS

2013/0151197 A1\* 6/2013 Vattathara ............... G06F 17/18
 702/179
2013/0182932 A1\* 7/2013 Chen ..................... G06T 11/008
 382/131

\* cited by examiner

CONTROL UNIT AND METHOD TO MONITOR A DATA ACQUISITION OF MAGNETIC RESONANCE IMAGE DATA

BACKGROUND OF THE INVENTION

Field of the Invention

The present invention concerns a control method to monitor a data acquisition of magnetic resonance image data, as well as a control unit to implement such a method.

Description of the Prior Art

Data acquisition of magnetic resonance image data is a widespread field of application, in particular in clinical use.

In a clinical environment, a suitable acquisition of magnetic resonance image data can represent an extremely complex problem, in particular for an efficient and goal-oriented imaging, especially if the image data sets should be created in an optimally small time window.

SUMMARY OF THE INVENTION

An object of the invention is to provide a method that optimizes the chronological acquisition of such image data without negatively affecting the quality of the image data for the underlying question that is posed.

A control method in accordance with the invention for monitoring a data acquisition of magnetic resonance image data of an imaging area located in a measurement volume of a magnetic resonance apparatus is thereby provided that includes the following steps:

a) radiate an RF excitation pulse by means of an RF transmission/reception device of the magnetic resonance apparatus, b) acquire raw data after a time after the radiated excitation pulse, by means of the RF transmission/reception device, and store the raw data, c) transmit the raw data to a monitoring unit and d) repeat steps a) through c) while switching different gradients ($G_x$, $G_y$, $G_z$) for spatial coding via readout of k-space corresponding to the imaging area along trajectories that are predetermined by the switched gradients ($G_x$, $G_y$, $G_z$), up to a termination criterion that is predetermined by the monitoring unit.

The radiation of the radio-frequency excitation pulse (RF excitation pulse)—the first method step—takes place with an RF transmission/reception device of the magnetic resonance apparatus. The RF excitation pulses are emitted by an radio-frequency power amplifier of the magnetic resonance apparatus. A radio-frequency antenna of the magnetic resonance apparatus translates the RF excitation pulses into an alternating magnetic field to excite nuclei of an examination subject, or of a region of the examination subject that is to be examined.

The acquisition of raw data after a time after the radiated excitation pulse—the second method step—likewise takes place with the RF transmission/reception device. The acquired raw data primarily include echo signals that result from the excitation of the nuclei and the alignment of the nuclear spins. However, the raw data can also be pulse shapes, voltage strengths or other variables that occur in magnetic resonance measurements. Following this, the raw data are stored and transmitted to a monitoring unit in a third method step.

A monitoring unit is a system that includes a processing unit, an operating system and advantageously an output unit.

A processing unit or a processor (central processing unit, CPU) is, for example, a microprocessor or digital signal processor (DSP). The processor (which is controlled by the program, which can be divided into a number of program modules) writes data to the memory, reads data from the memory and processes the data. For example, the processor can also be embodied as an (application-specific) field programmable (logic) gate array (field programmable gate array, FPGA).

For example, a memory unit can be a read-only memory (ROM) such as an electrically erasable programmable read-only memory (EEPROM) or Flash EEPROM, a read/write memory (random-access memory, RAM), or a disk storage (such as hard drive storage). The memory unit can be used to store a program (for example an operating system or an application program) and/or data (in particular image data, instruction data, configuration data, parameter data, protocol data and sequence data).

An operating system includes computer programs, the system resources (hardware components) of a computer (for example memory units such as working memory and hard disks); administers input and output units such as interfaces; and provides application programs. The operating system thus forms an interface between the system resources and the application programs.

For example, an output unit can be a monitor to present options, commands, parameter data, sequence data and/or graphical output of image data etc.

The three method steps are now repeated while switching (activating) different gradients ($G_x$, $G_y$, $G_z$) for spatially coding data entered into k-space corresponding to the imaging region along trajectories that are predetermined by the switched gradients ($G_x$, $G_y$, $G_z$), until a termination criterion (predetermined by the monitoring unit), that is dependent on the transmitted raw data, is achieved. The transmission of the raw data takes place immediately after the acquisition of the raw data.

An association between a measured (detected) magnetization of nuclear spins and a spatial coordinate of the measured magnetization typically takes place via an intermediate step. In this intermediate step, acquired raw data are entered into a memory organized as "k-space", wherein the coordinates of k-space are coded as a function of the gradient field. The gradient field modifies the resonance frequency (also called Larmor frequency) and, for example, also the phase position of the magnetization deflected by an RF pulse in a spatially dependent manner, such that spatial information is obtained by identification of the phase position and resonance frequency of the measured magnetization. In other words, the spatial information is based (with phase and frequency coding) on the coordinate system of k-space, namely the spatial frequency, and is determined as a function of the gradient field. The magnitude of the magnetization—in particular of the transverse magnetization, which is determined in a plane transverse to the basic magnetic field at a defined location of the examination subject—can be determined from the readout point with the use of a Fourier transformation, which calculates a signal strength of the signal in the spatial domain from a signal strength that indicates the magnitude of the magnetization that is in turn associated with a defined frequency, namely the spatial frequency.

The data entered into k-space thus form an inverse Fourier domain relative to the spatial domain of the examination subject, such that—with the use of a Fourier transformation—the magnetic resonance signals are transformed into the spatial domain to create the magnetic resonance image. The gradient field thus determines a point in k-space, with the curve of the change of the gradient field establishing a series of k-space points that is designated as the "trajectory" through k-space, or also as a "projection".

If k-space is not read out (filled with data at respective data entry points) with sufficient density in order to acquire all variations of the signal, artifacts can arise in the reconstructed image. In order to prevent this, the Nyquist condition should be complied with, which states that a signal with a sampling interval Δt can include no frequency that is greater than 1/(2Δt).

The invention makes use of the establishing (via a termination criterion provided by a monitoring unit) the time duration that k-space corresponding to the imaging area can be read out without negatively affecting the image data for the underlying question.

In a preferred embodiment, the raw data are also transmitted to a reconstruction unit to reconstruct an image. This transmission preferably takes place simultaneously with the transmission of the raw data to the monitoring unit. Such an image is a magnetic resonance image, and what is to be understood by a reconstruction unit means a unit that reconstructs a magnetic resonance image from the acquired raw data. It is thereby possible to generate the magnetic resonance image independent of the termination criterion that is used.

In an embodiment, the reconstruction of the image takes place in real time. As used herein, real time means that the reconstruction of the magnetic resonance image is initiated instantly after a number of transmission steps of the raw data to the reconstruction unit. A magnetic resonance image thus can be generated after each transmission of the raw data; however, a magnetic resonance image can also be generated after every other or every n-th transmission of the raw data, for example. It is thus ensured that the raw data acquired up to the transmission step are converted into a magnetic resonance image. There is no need to wait for the complete acquisition of the raw data. Other method steps also remain untouched by the reconstruction of the magnetic resonance image; there is thus also no need to wait for the complete reconstruction of the magnetic resonance image before the method can be started again. There are thus no time delays created whatsoever.

In a further embodiment, the reconstruction of the image includes the use of at least one image marker. As used herein, an image marker (also called an information marker) is an artificial image that has known contents and structures. This artificial image is first transformed into k-space that has the same size as k-space of the underlying magnetic resonance measurement. If a raw data point is acquired within the scope of the magnetic resonance measurement, the same point in k-space of the image marker is extracted and combined with the acquired raw data point, advantageously combined such that the artificial image is inserted into a region of a corner of the reconstructed image (because the noise ratio is higher and the signal ratio is lower in such a reconstruction of the reconstructed image, in comparison to another point). In this way, a reference image can be introduced into the reconstruction process. However, the artificial image can also be reconstructed as a separate image.

In an embodiment according to the invention, an information content of the image marker is determined, and an information content of the image is determined by means of the image content of the image marker. By a comparison of the image content of the image marker in the reconstructed image with the known image content of the known image marker in its desired state, conclusions can be drawn about the prevailing image quality. For example, if the region at the image marker that corresponds to the region at the clinically relevant magnetic resonance image is clearly apparent, it is to be assumed that this image region is likewise clearly perceptible, or at least that an additional scanning of k-space will deliver no significant improvement of the image quality. The information content itself can also be determined by a measure of entropy.

In a preferred embodiment, at least one of the reconstructed images is transmitted to the monitoring unit. In addition to the transmitted raw data, the images reconstructed using the raw data are thus present at the monitoring unit. The transmission of the images does not necessarily take place after each repetition step, but is possible after each repetition step; computing time and computing capacity can thus be saved. The transmission of the reconstructed images themselves thereby advantageously takes place immediately after the reconstruction of the images.

In an embodiment, the monitoring unit has an output unit to present the reconstructed image. In this way, the reconstructed image can thus be viewed and the process of the image presentation can be tracked.

In a further embodiment, the termination criterion is established by a user. If the information relevant to the underlying magnetic resonance examination is present, there is thus no need to wait for the completion of a magnetic resonance image; rather, the user has the possibility of ending the process of the image creation. This saves not only the measurement time but rather also costs, due to the smaller personnel time cost. The user hereby has the possibility to establish a termination criterion using the information available to him. For example, this information can be obtained using the raw data points of k-space, using the reconstructed magnetic resonance image or images, using information of the image markers, or using other information of the monitoring unit.

In an embodiment according to the invention, the termination criterion of the monitoring unit is determined or established using a threshold for the information content of the image. Such a determination or establishment of a threshold leads to an automated receipt of the termination criterion, such that this itself no longer needs to be determined by a user. Using the information already determined with the image marker, a threshold specific to the underlying question can be determined. If the review of the information content now yields an overrun or, respectively, underrun of the threshold, for example, this overrun or, respectively, underrun can thus be established as a termination criterion of the data acquisition of the magnetic resonance image data. This likewise saves measurement time and costs.

In a preferred embodiment, the method can be started again after fulfilling the termination criterion. It is thereby ensured that the production of the magnetic resonance image will still occur after an unfounded termination of the measurement process, or even if a complete image data set should be acquired, contrary to an original determination. The resumption advantageously takes place via a user.

In another embodiment, the type of readout of k-space can be modified by the monitoring unit. The manner by which k-space corresponding to the imaging area is read out along a trajectory is to be understood as a type of readout. Types of readout are—as an example, but not exclusively—line-by-line or radial readout. The variation of the type of readout advantageously takes place in real time, i.e. such that the imaging area is read out according to the new readout type within fewer repetition steps. This allows a fast reaction to changed boundary conditions to serve to make the measurement and monitoring operation more flexible.

In a further embodiment, readout takes place according to a random pattern wherein k-space is less dense than required by the Nyquist condition. Since the readout of k-space is less dense than required by the Nyquist condition, the acquisition of the magnetic resonance measurement data is accelerated. The image artifacts that are typically generated via such an undersampling given the reconstruction of images from the magnetic resonance measurement data that are connected with underdetermined equation systems are likewise minimized by avoiding correlations between the read-out k-space points. Via the random readout pattern, such an underdetermined equation system can be solved according to the theory of compressed sensing, and the images can be reconstructed without artifacts.

Within the scope of the present invention, a control unit is also provided to monitor a data acquisition of magnetic resonance image data of an imaging area located in a measurement volume of a magnetic resonance apparatus.

The control unit includes:
a processing unit that is designed to store raw data after acquiring said raw data by means of an RF transmission/reception device of the magnetic resonance apparatus, and to transmit the raw data to the monitoring unit, and
the monitoring unit that is designed to specify a termination criterion, after whose entry no additional raw data are acquired.

Furthermore, the present invention describes a non-transitory, computer-readable data storage medium that is encoded with programming instructions, which can be loaded into a memory unit of a programmable controller, or of a computer of a control unit. All or various embodiments of the control method according to the invention that have been described above can be executed when the programming instructions are executed in the controller or control device of the control unit. The programming instructions may require other program units—for example libraries and auxiliary functions—in order to realize the corresponding embodiments of the method. The programming instructions can be in source code that must still be compiled and linked or that must only be interpreted, or can be an executable software code that has only to be loaded into the computer for execution.

The electronically readable storage medium can be, for example a DVD, a magnetic tape or a USB stick, on which is stored electronically readable control information, in particular software.

The advantages of the control unit according to the invention, of the computer program according to the invention and of the electronically readable storage medium according to the invention essentially correspond to the advantages of the control method according to the invention, which are described above.

DESCRIPTION OF THE PREFERRED EMBODIMENTS

Figure 1:
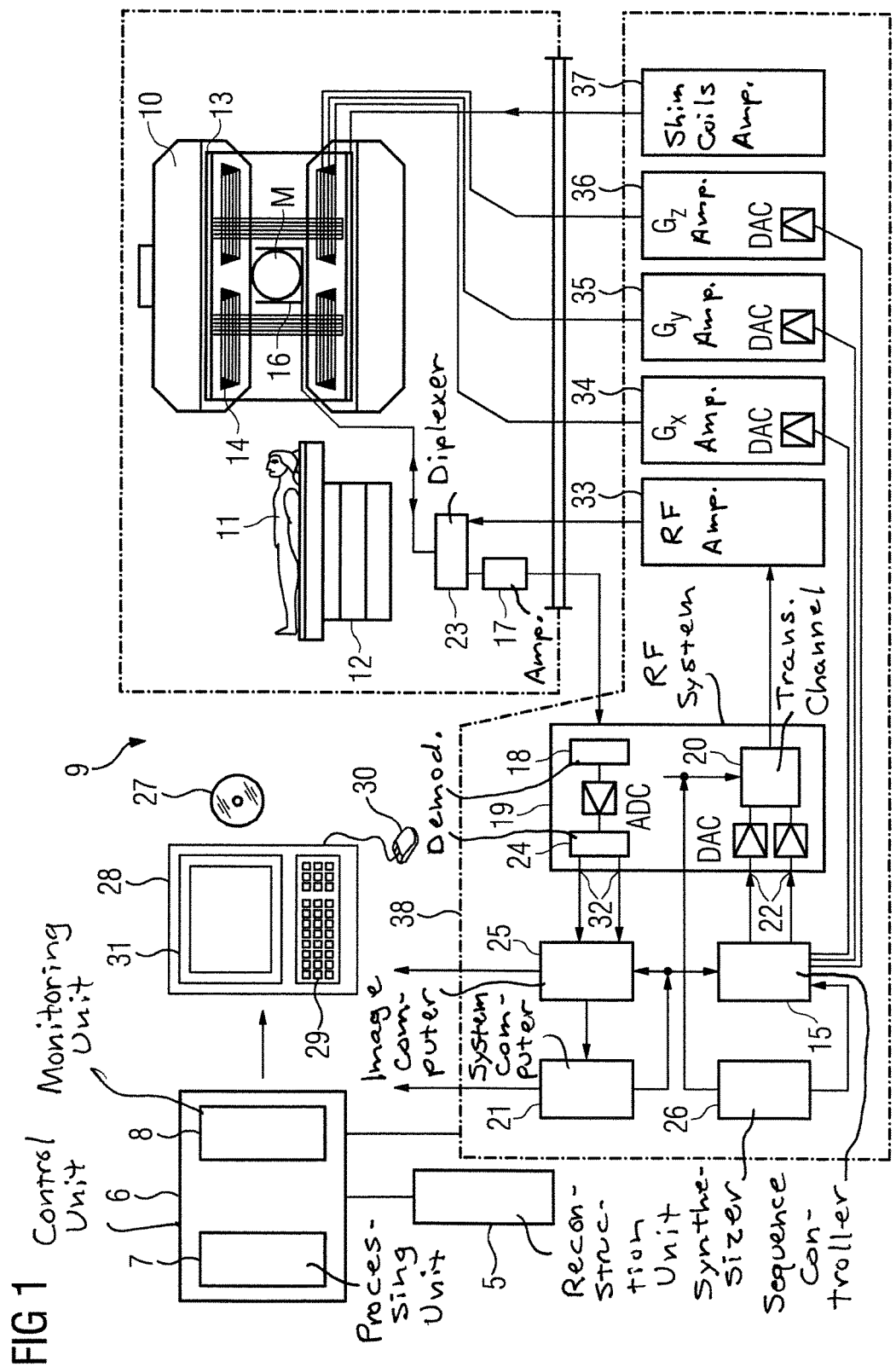
FIG. 1 schematically illustrates a magnetic resonance apparatus with a control unit according to the invention.

FIG. 1 schematically illustrates a magnetic resonance apparatus 9, which is also designated as a magnetic resonance imaging apparatus or nuclear magnetic resonance tomography apparatus. A basic field magnet 10 of the magnetic resonance apparatus 9 generates a temporally constant, strong magnetic field $B_0$ for polarization or alignment of the nuclear spins in an examination region of an examination subject 11, for example of a part of a human body that is to be examined which—resting on an examination table 12—is slid into the magnetic resonance apparatus 9 for examination. The high homogeneity of the basic magnetic field $B_0$ that is required for the magnetic resonance measurement (data acquisition) is defined in a typically spherical measurement volume M into which the examination subject 11 is slid. To support the homogeneity requirements, and in particular to eliminate temporally invariable influences, the magnetic resonance apparatus has shim plates made of a ferromagnetic material at a suitable location. If they are unwanted, temporally variable influences are eliminated by shim coils 13 and operated by a shim coils amplifier 37 of said shim coils 13.

The basic field magnet 10 likewise serves as a housing of a cylindrical gradient field system 14 of the magnetic resonance apparatus 9, which has three sub-windings, for example. Each sub-winding is supplied with current by a corresponding amplifier 34—36 of the magnetic resonance apparatus 9 so as to generate a linear (also temporally variable) gradient field in the respective direction of a Cartesian coordinate system. The first sub-winding of the gradient field system 14 generates a gradient $G_x$ in the x-direction; the second sub-winding generates a gradient $G_y$ in the y-direction; and the third sub-winding generates a gradient $G_z$ in the z-direction. Furthermore, the nonlinear gradients are also generated by the gradient field system 14. The amplifiers 34—36 each contain a digital/analog converter DAC, which is activated by a sequence controller 15 of the magnetic resonance apparatus 9 for accurately timed generation of gradient pulses.

The magnetic resonance apparatus 9 also has at least one radio-frequency antenna 16 within the gradient field system 14. This is at least one radio-frequency antenna 16 converts the radio-frequency pulses emitted by a radio-frequency power amplifier of the magnetic resonance apparatus 9 into an alternating magnetic field for excitation of the nuclei by deflecting the nuclear spins of the examination subject 11 to be examined, or of the region of the examination subject 11 that is to be examined, out of alignment with the basic magnetic field. The control of the coils and the evaluation of received signals takes place in a control device 38 of the magnetic resonance apparatus 9. The radio-frequency antenna 16 has one or more RF transmission coils and multiple RF reception coils in the form of an annular, linear or matrix-like arrangement of component coils, for example. The alternating field emanating from the precessing nuclear spins—i.e. normally the nuclear spin echo signals caused by a pulse sequence made up of one or more radio-frequency pulses and one or more gradient pulses—is also converted by the RF reception coils of the RF antenna 16 into a voltage (i.e. a measurement signal) which is supplied via an amplifier 17 to a radio-frequency reception channel of a radio-frequency system 19. The radio-frequency system 19 of the magnetic resonance system 9 furthermore has a transmission channel 20 in which the radio-frequency pulses are generated for the excitation of the nuclear magnetic resonance. The respective radio-frequency pulses are digitally represented in the sequence controller 15 as a series of complex numbers based on a pulse sequence predetermined by the system computer 21. This number sequence is supplied as a real part and imaginary part to a digital/analog converter DAC in the radio-frequency system 19 via respective inputs 22 and from said digital/analog converter DAC to the transmission channel 20. In the transmission channel 20 the pulse sequences are modulated on a radio-frequency carrier signal whose base frequency corresponds to the resonance frequency of the nuclear spins in the measurement volume. The modulated pulse sequences of the RF transmission coil are supplied to the radio-frequency antenna 16 via an amplifier 33.

The switching from transmission operation to reception operation takes place via a transmission/reception diplexer 23. The RF transmission coil of the radio-frequency antenna 16 radiates the radio-frequency pulses for excitation of the nuclear spins into the measurement volume M and scans resulting echo signals via the RF reception coils. The acquired magnetic resonance signals are phase-sensitively demodulated on an intermediate frequency in a first demodulator 18 of the reception channel of the radio-frequency system 19 and digitized in an analog/digital converter ADC. This signal is further demodulated to a frequency of zero. The demodulation to a frequency of zero and the separation into real part and imaginary part occur in a second demodulator 24 of the reception channel of the radio-frequency system 19 after the digitization in the digital domain, which demodulator 24 outputs the demodulated data to an image computer 25 via outputs 32.

An MR image is reconstructed by the image computer 25 of the magnetic resonance apparatus 9 from the measurement data acquired in such a manner. The administration of the measurement data, the image data and the control programs takes place via the system computer 21 of the magnetic resonance apparatus 9. Based on a specification with control programs, the sequence controller 15 monitors the generation of the respective desired pulse sequences and the corresponding scanning of k-space. In particular, the sequence controller 15 controls the accurately-timed switching of the gradients, the emission of the radio-frequency pulses with defined phase amplitude and the reception of the nuclear magnetic resonance signals. The time base for the radio-frequency system 19 and the sequence controller 15 is provided by a synthesizer 26 of the magnetic resonance apparatus 9. The selection of corresponding control programs to generate an MR image—which control programs are stored on computer-readable storage medium 27, for example a DVD—and the presentation of the generated MR image take place via a terminal 28 of the magnetic resonance apparatus 9 that has a keyboard 29, a mouse 30 and an output unit 31 (for example a monitor).

Naturally, the presented magnetic resonance apparatus 9 can include additional components that magnetic resonance apparatuses 9 conventionally have. The general functioning of a magnetic resonance apparatus 9 is known to those skilled in the art, such that the a detailed description of the general components is not necessary herein.

A control unit 6 according to the invention and a reconstruction unit 5 are connected with the magnetic resonance apparatus 9. The control unit 6 comprises a processing unit 7 and a monitoring unit 8.

The control unit 6 serves to monitor a data acquisition of magnetic resonance image data of an imaging area located in the measurement volume M of the magnetic resonance apparatus 9.

The processing unit 7 is designed to store raw data after acquisition of said raw data by means of the RF transmission/reception device of the magnetic resonance apparatus 9, and to transmit the raw data to the monitoring unit 8.

The monitoring unit 8 is designed to specify a termination criterion after whose appearance additional raw data can no longer be acquired.

The reconstruction unit 6 is designed to reconstruct an image using the magnetic resonance image data.

The control unit 6 can also be implemented as a processor unit, in particular as a graphics processor in a graphics card.

Figure 2:
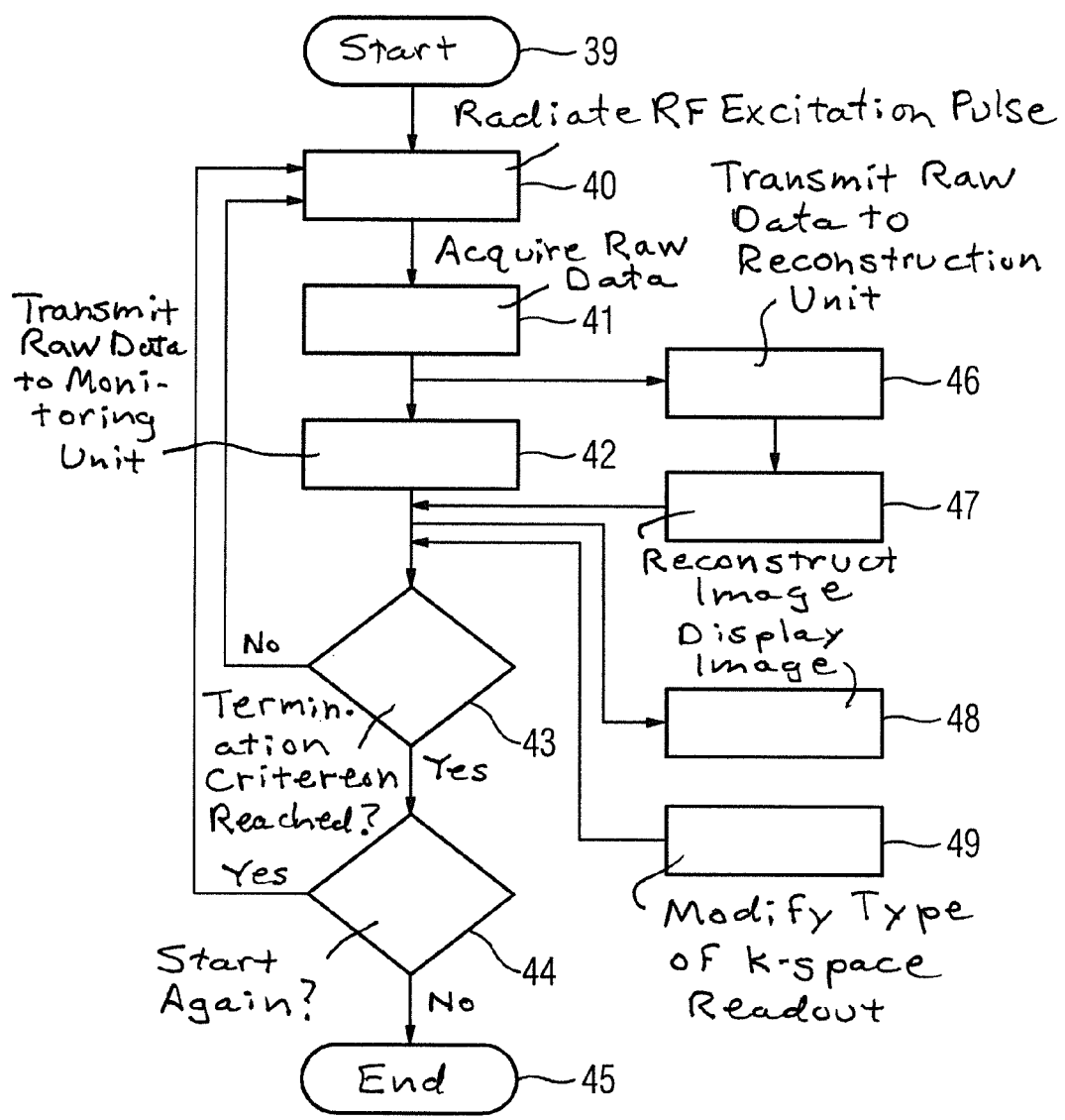
FIG. 2 is a flowchart of an embodiment of the method according to the invention.

FIG. 2 show a flowchart of a method according to the invention. The method includes the method steps 39 through 49, wherein portions of the Specification including the corresponding reference characters introduced in connection with the other Figure are also used in the description of the method steps 39 through 49.

A first method step 39 identifies the start of a monitoring of a data acquisition of magnetic resonance image data of an imaging area located in a measurement volume M of a magnetic resonance apparatus 9.

In the method step 40, an RF excitation pulse is radiated by means of an RF transmission/reception device of the magnetic resonance apparatus 9. The RF excitation pulse is emitted by a radio-frequency power amplifier 17 of the magnetic resonance apparatus 9. A radio-frequency antenna 16 of the magnetic resonance apparatus 9 converts the RF excitation pulses into an alternating magnetic field to excite nuclei and to align nuclear spins of an examination subject 11, or of a region of the examination subject 11 that is to be examined.

During the method step 41, raw data are acquired after a time after the radiated excitation pulse by means of the RF transmission/reception device, and these raw data are stored. The acquired raw data primarily include echo signals that result from the excitation of the nuclei and the alignment of the nuclear spins. However, the raw data can also include pulse shapes, voltage levels or other variables occurring in magnetic resonance measurements.

In the method step 42, the raw data are transmitted to a monitoring unit 8. However, in the method step 46 the raw data can also be transmitted to a reconstruction unit 5 to reconstruct an image. This transmission advantageously takes place simultaneously with the transmission of the raw data to the monitoring unit 8. It is thus possible to generate the magnetic resonance image independent of a termination criterion that is used.

The actual reconstruction of the image takes place during the method step 47. The reconstruction advantageously takes place in real time. A magnetic resonance image can thus be generated immediately after transmission of the raw data; however, magnetic resonance image can also be generated after every other or every n-th transmission of the raw data, for example. It can thereby be ensured that the raw data acquired up to the transmission step are converted into a magnetic resonance image. There is no need to wait for the complete acquisition of the raw data. The reconstruction also advantageously takes place using at least one image marker. As used herein, image marker (also called an information marker) is an artificial image that has known contents and structures. This artificial image is first transformed into k-space that has the same size as k-space of the underlying magnetic resonance measurement. If a raw data point is acquired within the scope of the magnetic resonance measurement, the same point in k-space of the image marker is thus extracted and combined with the acquired raw data point, preferably combined such that the artificial image is inserted into a region of a corner of the reconstructed image (because the noise ratio is higher and the signal ratio is lower in such a region of the reconstructed image, in comparison to another point). In this way, a reference image can be introduced into the reconstruction process. The information content of the image marker is determined, and an information content of the image is determined from the information content of the image marker. Conclusions about the prevailing image quality can be made by a comparison of the image marker at the reconstructed image with the known image marker in its desired state. If the region at the image marker—which corresponds to the region at the clinically relevant magnetic resonance image—is clearly perceptible, it is to be assumed that this is likewise clearly perceptible, or at least that an additional scanning of k-space will yield no significant improvement of the image quality. The information content itself can also be determined by means of measures of entropy, for example. At least one of the reconstructed images is advantageously also transmitted to the monitoring unit 8 so that—in addition to the transmitted raw data—the images reconstructed using the raw data are also present at the monitoring unit. The transmission to the monitoring unit thereby takes place immediately after the reconstruction of the images.

In method step 48, the reconstructed image is output by an output unit of the monitoring unit 8. The reconstructed image thus can be viewed immediately, and the process of the image creation can be tracked.

The type of readout of k-space is modified by the monitoring unit 8 in method step 49. The manner by which k-space corresponding to the imaging area is read out along a trajectory is to be understood as a type of readout. Types of readout are—for example but not exclusively—line-by-line or radial readout. The modification of the type of readout advantageously takes place in real time, i.e. such that the imaging area is read out according to the new readout type within a few repetition steps. Readout of k-space preferably takes place according to a random pattern with lower density than is required by the Nyquist condition, and the acquisition of the magnetic resonance measurement data is thus accelerated. The image artifacts that are typically generated via such an undersampling in the reconstruction of images from the magnetic resonance measurement data (which are linked with underdetermined equation systems) are likewise minimized by avoiding correlations between the read-out k-space points. Via the random readout patterns, such an underdetermined equation system can be solved according to the theory of compressed sensing, and the images can be reconstructed without artifacts.

The three method steps 40 through 42 are repeated while switching different gradients $G_x$, $G_y$, $G_z$, for spatial coding via readout of k-space corresponding to the imaging area along trajectories that are predetermined by said switched gradients $G_x$, $G_y$, $G_z$, until a termination criterion provided by the monitoring unit 8 is reached. The termination criterion itself can also be established by a user, or it can be determined or established by the monitoring unit 8 using a threshold for the information content of the image. A threshold specific to the underlying question can be determined using the information content already determined with the image marker. If the review of the information content now yields an overrun or underrun of the threshold, this overrun, or underrun, can be established as a termination criterion for the data acquisition of the magnetic resonance image data.

In method step 43 a check is made as to whether the termination criterion predetermined by the monitoring unit 8 has already been achieved. If this is the case, the method continues with method step 44; otherwise, it continues with method step 40.

During method step 44 a check is made as to whether the method should be started again after the termination criterion has been entered. It is thereby ensured that the completion of the magnetic resonance image occurs after an unfounded termination of the measurement process, or even if—contrary to an original determination—a complete image data set should be acquired. If this is the case, the method is continued with method step 45; otherwise, it is continued with method step 40. The resumption of the method is thereby brought about by a user.

A last method step 45 identifies the end of the monitoring of a data acquisition of magnetic resonance image data of an imaging area located in a measurement volume M of a magnetic resonance apparatus 9.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance imaging (MRI) control method that operates an MRI apparatus in order to acquire a complete diagnostic magnetic resonance (MR) data set from an imaging area situated in a measurement volume of the MRI apparatus, said MRI control method comprising:
    (a) using a control processor to operate the MRI apparatus to radiate a radio-frequency (RF) pulse that excites nuclear spins in the imaging area;
    (b) using the control processor to operate the MRI apparatus, at a time after radiating said RF pulse, in order to acquire MR signals produced by the excited nuclear spins, and to activate gradient fields in said MRI apparatus in order to enter the MR signals, as raw MR data, into an electronic memory organized as k-space, along a data entry trajectory in k-space, selected from the group consisting of Cartesian trajectories and non-Cartesian trajectories, that is defined by said gradient fields and defining, said data entry trajectory with said gradient fields in order to intentionally cause said raw MR data entered in k-space along said data entry trajectory not to satisfy the Nyquist criterion;
    (c) at a transmission time that occurs before the acquisition of said complete diagnostic MR data set from said imaging area, transmitting said raw MR data in k-space to a monitoring processor and to an image reconstruction processor;
    (d) in said reconstruction processor, reconstructing an image of the image area from the raw MR data transmitted in (c), and providing said MR image to said monitoring processor;
    (e) in said monitoring processor, analyzing an image quality of said MR image reconstructed in (d) with respect to a predetermined termination criterion related to a predetermined image quality of said complete set of diagnostic MR data;
    (f) repeating (a) through (e) until the MR image reconstructed in (d) satisfies said termination criterion by, in each repetition of (d), changing said gradients so as to change said data entry trajectory in k-space to a different data entry trajectory in said group; and
    (g) making the reconstructed MR image that satisfies said termination criterion available from said monitoring processor in electronic form as a data file.

2. A magnetic resonance imaging (MRI) control computer system that operates an MRI apparatus in order to acquire a complete diagnostic magnetic resonance (MR) data set from an imaging area situated in a measurement volume of the MRI apparatus, said MRI control method comprising:

a control processor, a monitoring processor, and an image reconstruction processor;

said control processor being configured to (a) operate the MRI apparatus to radiate a radio-frequency (RF) pulse that excites nuclear spins in the imaging area;

said control processor being configured to (b) operate the MRI apparatus, at a time after radiating said RF pulse, in order to acquire MR signals produced by the excited nuclear spins, and to activate gradient fields in said MRI apparatus in order to enter the MR signals, as raw MR data, into an electronic memory organized as k-space, along a data entry trajectory in k-space, selected from the group consisting of Cartesian trajectories and non-Cartesian trajectories, that is defined by said gradient fields, said control processor being configured to set said gradient fields so as to define said data entry trajectory with said gradient fields in order to intentionally cause said raw MR data entered in k-space along said/data entry trajectory not to satisfy the Nyquist criterion;

said control processor being configured to (c) transmit said raw MR data in k-space to said monitoring processor and to said image reconstruction processor, at a transmission time that occurs before the acquisition of said complete diagnostic MR data set from said imaging area;

said reconstruction processor being configured to (d) reconstruct an image of the image area from the raw MR data transmitted in (c), and to provide said MR image to said monitoring processor;

said monitoring processor being configured to (e) analyze an image quality of said MR image reconstructed in (d) with respect to a predetermined termination criterion related to a predetermined image quality of said complete set of diagnostic MR data;

said control processor and said monitoring processor and said image reconstruction processor being configured to repeat (a) through (e) until the MR image reconstructed in (d) satisfies said termination criterion by, in each repetition of (d), changing said gradients so as to change said data entry trajectory in k-space to a different data entry trajectory in said group; and said monitoring processor being configured to make the reconstructed MR image that satisfies said termination criterion available from said monitoring processor in electronic form as a data file.

3. A non-transitory, computer-readable data storage medium encoded with programming instructions, said storage medium being loaded into a magnetic resonance imaging (MRI) control computer system of an MRI apparatus, in order to acquire a complete diagnostic magnetic resonance (MR) data set from an imaging area situated in a measurement volume of the MRI apparatus, said MRI control computer system comprising control processor, a monitoring processor, and an image reconstruction processor, and said programming instructions causing said control computer system to:

operate the MRI apparatus with said control processor in order to (a) radiate a radio-frequency (RF) pulse that excites nuclear spins in the imaging area;

operate the MRI apparatus with said control processor, at a time after radiating said RF pulse, in order to (b) acquire MR signals produced by the excited nuclear spins, and to activate gradient fields in said MRI apparatus in order to enter the MR signals, as raw MR data, into an electronic memory organized as k-space, along a data entry trajectory in k-space, selected from the group consisting of Cartesian trajectories and non-Cartesian trajectories, that is defined by said gradient fields, and to set said gradient fields so as to define said data entry trajectory with said gradient fields in order to intentionally cause said raw MR data entered in k-space along said data entry trajectory not to satisfy the Nyquist criterion;

at a transmission time that occurs before the acquisition of said complete diagnostic MR data set from said imaging area, (c) transmit said raw MR data in k-space to said monitoring processor and to said image reconstruction processor;

in said reconstruction processor, (d) reconstruct an image of the image area from the raw MR data transmitted in (c), and providing said MR image to said monitoring processor;

in said monitoring processor, (e) analyze an image quality of said MR image reconstructed in (d) with respect to a predetermined termination criterion related to a predetermined image quality of said complete set of diagnostic MR data;

repeat (a) through (e) until the MR image reconstructed in (d) satisfies said termination criterion by, in each repetition of (d), changing said gradients so as to change said data entry trajectory in k-space to a different data entry trajectory in said group; and make the reconstructed MR image that satisfies said termination criterion available from said monitoring processor in electronic form as a data file.

4. An MRI control method as claimed in claim 1 comprising reconstructing said MR image in (c) using at least one image marker.

5. An MRI control method as claimed in claim 4 comprising, in said image reconstruction processor, determining an informational content of said image marker.

6. An MRI control method as claimed in claim 5 comprising providing said reconstructed MR image to said monitoring processor in (d), together with said determined information content.

7. An MRI control method as claimed in claim 5 comprising establishing said predetermined termination criterion in said monitoring processor dependent on a relationship of said information content to a predetermined threshold.

8. An MRI control method as claimed in claim 6 comprising visually displaying the reconstructed MR image transmitted to the monitoring processor at a display screen in communication with said monitoring processor.

9. An MRI control method as claimed in claim 1 comprising manually establishing a selected termination criterion, and manually entering said selected termination criterion into said monitoring processor as said predetermined termination criterion.

10. An MRI control method as claimed in claim 1 comprising restarting a further repetition of (a) through (f) after fulfillment of said termination criterion.

* * * * *